(12) United States Patent
Chang et al.

(10) Patent No.: US 12,261,052 B2
(45) Date of Patent: Mar. 25, 2025

(54) HIGH ELECTRON MOBILITY TRANSISTOR AND FABRICATING METHOD OF THE SAME

(71) Applicant: UNITED MICROELECTRONICS CORP., Hsin-Chu (TW)

(72) Inventors: Ming-Hua Chang, Tainan (TW); Kun-Yuan Liao, Hsinchu (TW); Lung-En Kuo, Tainan (TW); Chih-Tung Yeh, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/608,940

(22) Filed: Mar. 19, 2024

(65) Prior Publication Data

US 2024/0222133 A1 Jul. 4, 2024

Related U.S. Application Data

(62) Division of application No. 17/515,541, filed on Oct. 31, 2021, now Pat. No. 12,002,681.

(30) Foreign Application Priority Data

Oct. 12, 2021 (CN) .......................... 202111185692.8

(51) Int. Cl.
*H10D 30/01* (2025.01)
*H01L 21/306* (2006.01)
(Continued)

(52) U.S. Cl.
CPC .... *H01L 21/3086* (2013.01); *H01L 21/30621* (2013.01); *H01L 21/3081* (2013.01);
(Continued)

(58) Field of Classification Search
CPC . H01L 21/3086; H10D 30/015; H10D 30/475
See application file for complete search history.

(56) References Cited

U.S. PATENT DOCUMENTS 9,385,001 B1 * 7/2016 He ...................... H01L 29/7786
10,062,943 B2 8/2018 Li
(Continued)

OTHER PUBLICATIONS

Yang, the specification, including the claims, and drawings in the U.S. Appl. No. 17/333,045, filed May 28, 2021.

*Primary Examiner* — Douglas M Menz
(74) *Attorney, Agent, or Firm* — Winston Hsu

(57) ABSTRACT

A fabricating method of a high electron mobility transistor includes providing a substrate. Then, a channel layer, an active layer, a P-type group III-V compound material layer, a metal compound material layer, a hard mask material layer and a patterned photoresist are formed to cover the substrate. Later, a dry etching process is performed to etch the hard mask material layer and the metal compound material layer to form a hard mask and a metal compound layer by taking the patterned photoresist as a mask. During the dry etching process, a spacer generated by by-products is formed to surround the patterned photoresist, the hard mask and the metal compound layer. After the dry etching process, the P-type group III-V compound material layer is etched by taking the spacer and the patterned photoresist as a mask.

4 Claims, 4 Drawing Sheets

(51) Int. Cl.
  *H01L 21/308* (2006.01)
  *H10D 30/47* (2025.01)
  *H10D 62/824* (2025.01)
  *H10D 62/85* (2025.01)

(52) U.S. Cl.
  CPC ....... *H01L 21/3085* (2013.01); *H10D 30/015* (2025.01); *H10D 30/475* (2025.01); *H10D 62/824* (2025.01); *H10D 62/8503* (2025.01)

(56) References Cited

U.S. PATENT DOCUMENTS

| | | |
|---|---|---|
| 10,109,474 B1 | 10/2018 | Wang |
| 10,153,342 B1 | 12/2018 | He |
| 10,262,986 B2 | 4/2019 | Dai |
| 10,460,980 B2 | 10/2019 | Verma |
| 10,896,969 B2* | 1/2021 | Iucolano ............ H01L 29/7786 |
| 10,985,271 B2 | 4/2021 | Yang |
| 11,081,579 B2 | 8/2021 | Chang |
| 11,239,327 B2 | 2/2022 | Lee |
| 11,264,492 B2 | 3/2022 | Huang |
| 11,296,214 B2 | 4/2022 | Lee |
| 2012/0175631 A1 | 7/2012 | Lidow |
| 2015/0340237 A1* | 11/2015 | Rezanezhad Gatabi .................... H01L 29/423 438/283 |
| 2018/0277650 A1* | 9/2018 | Matsushita ....... H01L 21/31144 |
| 2019/0157094 A1 | 5/2019 | Lin |
| 2020/0235218 A1 | 7/2020 | Stoffels |

\* cited by examiner

HIGH ELECTRON MOBILITY TRANSISTOR AND FABRICATING METHOD OF THE SAME

CROSS REFERENCE TO RELATED APPLICATIONS

This application is a division of U.S. application Ser. No. 17/515,541, filed on Oct. 31, 2021. The content of the application is incorporated herein by reference.

BACKGROUND OF THE INVENTION

1. Field of the Invention

The present invention relates to a fabricating method of a high electron mobility transistor, and more particularly to a method of using by-products formed during a dry etching process as a mask to form a high electron mobility transistor

2. Description of the Prior Art

Due to their semiconductor characteristics, III-V semiconductor compounds may be applied in many kinds of integrated circuit devices, such as high power field effect transistors, high frequency transistors, or high electron mobility transistors. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

Generally, a normally-off high electron mobility transistor uses a gate formed by P-type group III-V compound to control its switches. However, during the process of forming the gate, the surface of the P-type group III-V gate is often damaged due to the etching process. Therefore, it is necessary to find a new way to prevent the P-type group III-V gate from being damaged during the etching process.

SUMMARY OF THE INVENTION

In light of above, the present invention provides a structure with a metal compound layer disposed on the P-type group III-V gate. The metal compound layer can protect the surface of the P-type group III-V gate during the etching process. However, in the final structure, if the width of the metal compound layer is the same as the width of the P-type group III-V gate, leakage current will be generated under the P-type group III-V gate. Therefore, the width of the metal compound layer is reduced to solve the problem of leakage current. Accordingly, the present invention also provides a manufacturing method for reducing the width of the metal compound layer.

According to a preferred embodiment of the present invention, a fabricating method of a high electron mobility transistor includes providing a substrate. Next, a channel layer, an active layer, a P-type group III-V compound material layer, a metal compound material layer, a hard mask material layer and a photoresist are formed from bottom to top to cover the substrate. Subsequently, the photoresist is patterned to form a patterned photoresist. After that, a dry etching process is performed to etch the hard mask material layer and the metal compound material layer to transform the hard mask material layer into a hard mask and the metal compound material layer into a metal compound layer by taking the patterned photoresist as a first mask, wherein a spacer generated by by-products surrounds the patterned photoresist, the hard mask and the metal compound layer, and the by-products are formed during the dry etching process. After the dry etching process, the P-type group III-V compound material layer is etched by taking the spacer and the patterned photoresist as a second mask. Finally, the spacer, the patterned photoresist and the hard mask are removed.

According to another preferred embodiment of the present invention, a high electron mobility transistor includes a substrate. A channel layer, an active layer, a P-type group III-V gate and a metal compound layer are disposed on the substrate, wherein the channel layer, the active layer, the P-type group III-V gate and the metal compound layer are disposed from bottom to top. The metal compound layer contacts the P-type group III-V gate, the metal compound layer has two sidewalls which are opposed to each other, two acute angles are respectively formed between one of the two sidewalls and a top surface of the P-type group III-V gate and between the other of the two sidewalls and the top surface of the P-type group III-V gate. A source electrode, a drain electrode and a gate electrode are disposed on the active layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2, FIG. 3A, FIG. 3B, FIG. 4 to FIG. 6 depict a fabricating method of a high electron mobility transistor according to a preferred embodiment of the present invention, wherein:

FIG. 1 shows a substrate with a channel layer, an active layer, a P-type group III-V compound material layer, a metal compound material layer, a hard mask material layer and a photoresist thereon;

FIG. 2 is a fabricating stage following FIG. 1;

FIG. 3A is a fabricating stage following FIG. 2;

FIG. 3B depicts a top view of FIG. 3A;

FIG. 4 is a fabricating stage following FIG. 3A;

FIG. 5 is a fabricating stage following FIG. 4; and

FIG. 6 is a fabricating stage following FIG. 5.

DETAILED DESCRIPTION

Figure 1:
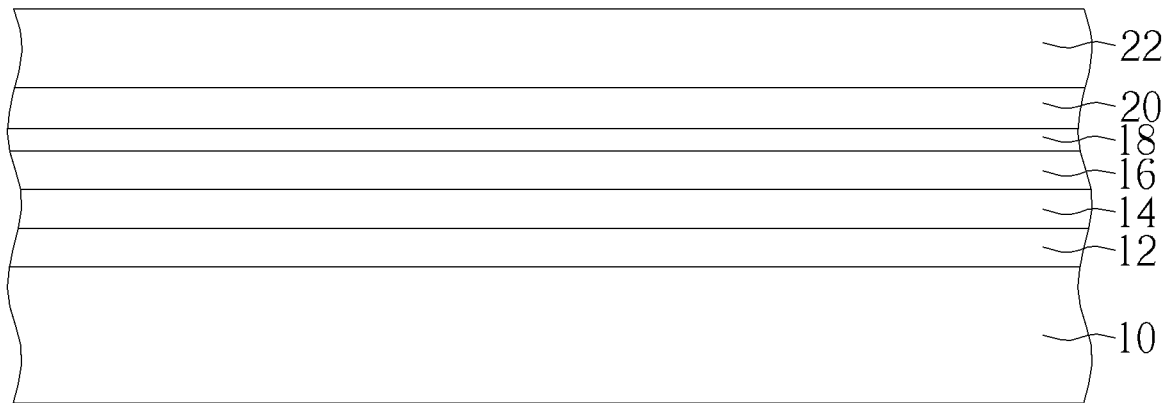
Figure 2:
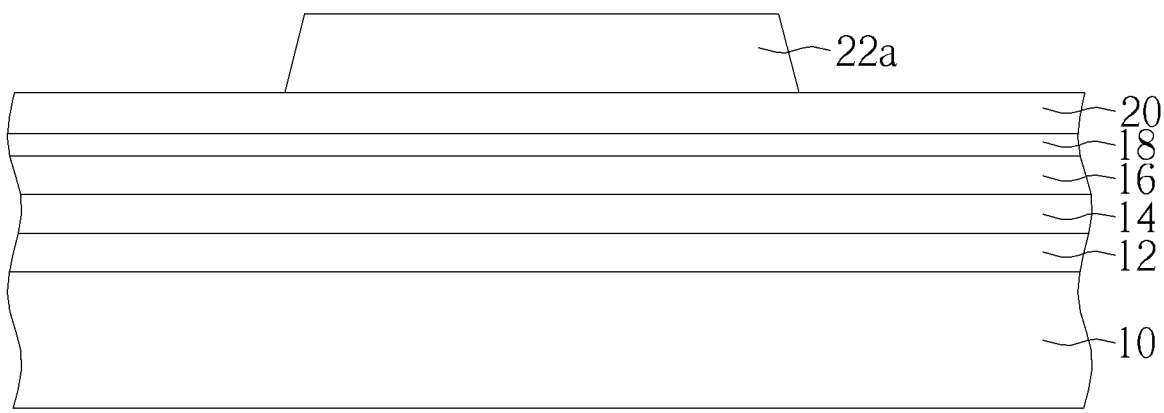
Figure 3A:
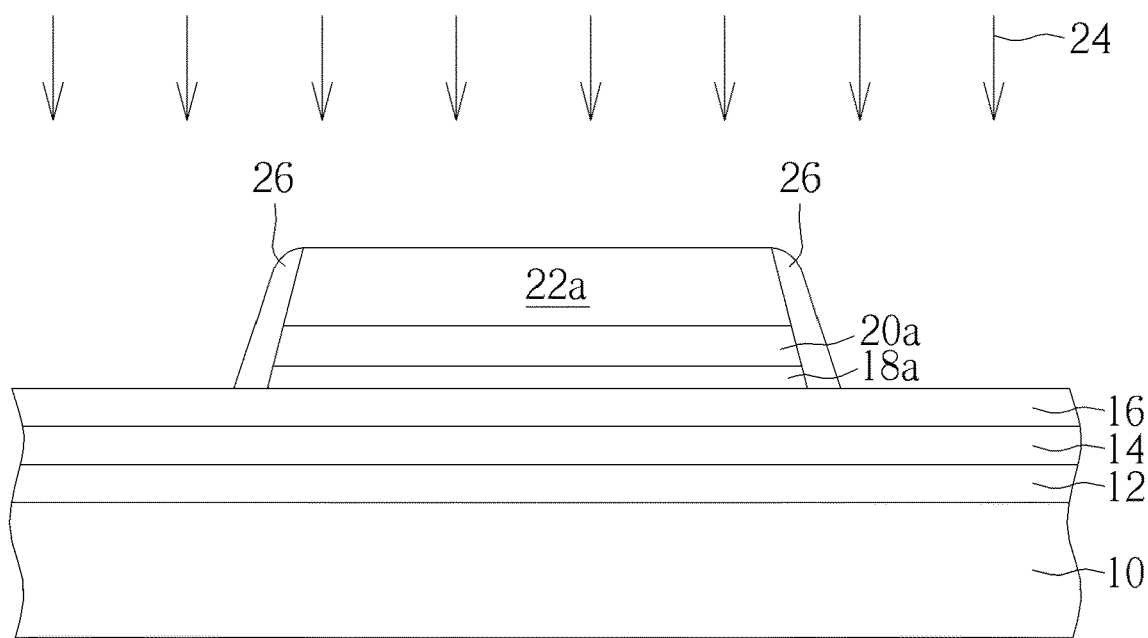
Figure 3B:
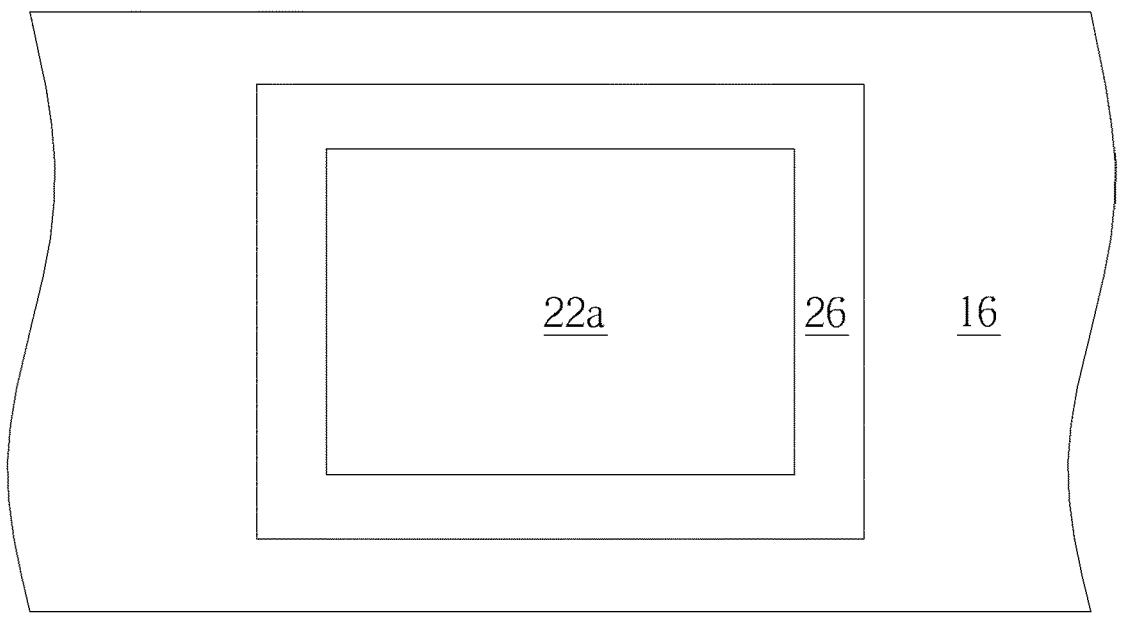

FIG. 1, FIG. 2, FIG. 3A, FIG. 3B, FIG. 4 to FIG. 6 depict a fabricating method of a high electron mobility transistor according to a preferred embodiment of the present invention, wherein FIG. 3B depicts a top view of FIG. 3A.

As shown in FIG. 1, a substrate 10, a channel layer 12, an active layer 14, a P-type group III-V compound material layer 16, a metal compound material layer 18, a hard mask material layer 20 and a photoresist 22 are formed to cover the substrate 10 in sequence. The substrate 10, the channel layer 12, the active layer 14, the P-type group III-V compound material layer 16, the metal compound material layer 18, the hard mask material layer 20 and the photoresist 22 are stacked from bottom to top. Next, as shown in FIG. 2, the photoresist 22 is etched to be transformed into a patterned photoresist 22a. The pattern which will be patterned into the metal compound material layer 18 is defined on the patterned photoresist 22a. The P-type group III-V compound material layer 16 includes P-type gallium nitride. The metal compound material layer 18 includes titanium nitride or tantalum nitride. The hard mask material layer 20 includes silicon nitride. The metal compound material layer 18 used in this embodiment is titanium nitride.

As shown in FIG. 2, FIG. 3A and FIG. 3B, a dry etching process 24 is performed. The dry etching process 24 includes dry etching the hard mask material layer 20 and the metal compound material layer 18 by taking the patterned photoresist 22a as a first mask. It is noteworthy that when the hard mask material layer 20 and the metal compound material layer 18 are dry etched, by-products generated during the dry etching process 24 attach on the hard mask material layer 20 and the metal compound material layer 18. As the dry etching process 24 is processing, the by-products are getting thicker, and a spacer 26 will be formed by by-products when the dry etching process 24 is completed. After the dry etching process 24, the hard mask material layer 20 is transformed into a hard mask 20a, the metal compound material layer 18 is transformed into a metal compound layer 18a, and the spacer 26 formed by by-products surrounds the patterned photoresist 22a, the hard mask 20a and the metal compound layer 18a. The composition of the spacer 26 includes C, Si, F, Ti or Cl. If different etching gas is used during the dry etching process 24, compositions of the spacer 26 will become different. For example, the spacer 26 could be polymers containing C, F and Cl.

According a preferred embodiment of the present invention, the etching gas used during the dry etching process 24 includes $C_4F_8$, $SF_6$, $CF_4$, $CH_xF_{4-x}$, $BCl_3$ or $Cl_2$. X is a positive number which is smaller than 4. Furthermore, gas such as He can be used to dilute the concentration of the etching gas. Moreover, an operational power of the dry etching process is preferably greater than 100 W, and an operational pressure of the dry etching process is greater than 50 mTorr. The spacer 26 can be formed more easily when the operational pressure is greater. In addition, a thickness of the spacer 26 can be adjusted by changing parameters of the dry etching process 24 such as changing the flow rate of etching gas, using different etching gas, adjusting the operational pressure or adjusting the operational power. For example, etching gas used during the dry etching process 24 may include $CHF_3$ and $SF_6$, and the etching gas is diluted by He. Concentration of $SF_6$ is between 3 and 20 standard cubic centimeter per minute (sccm). Concentration of $CHF_3$ is between 20 and 80 sccm. Concentration of He is between 50 and 200 sccm. The operational pressure of the dry etching process 24 is between 700 and 1300 mTorr. The operational pressure of the dry etching process 24 is between 200 and 800 W.

Figure 4:
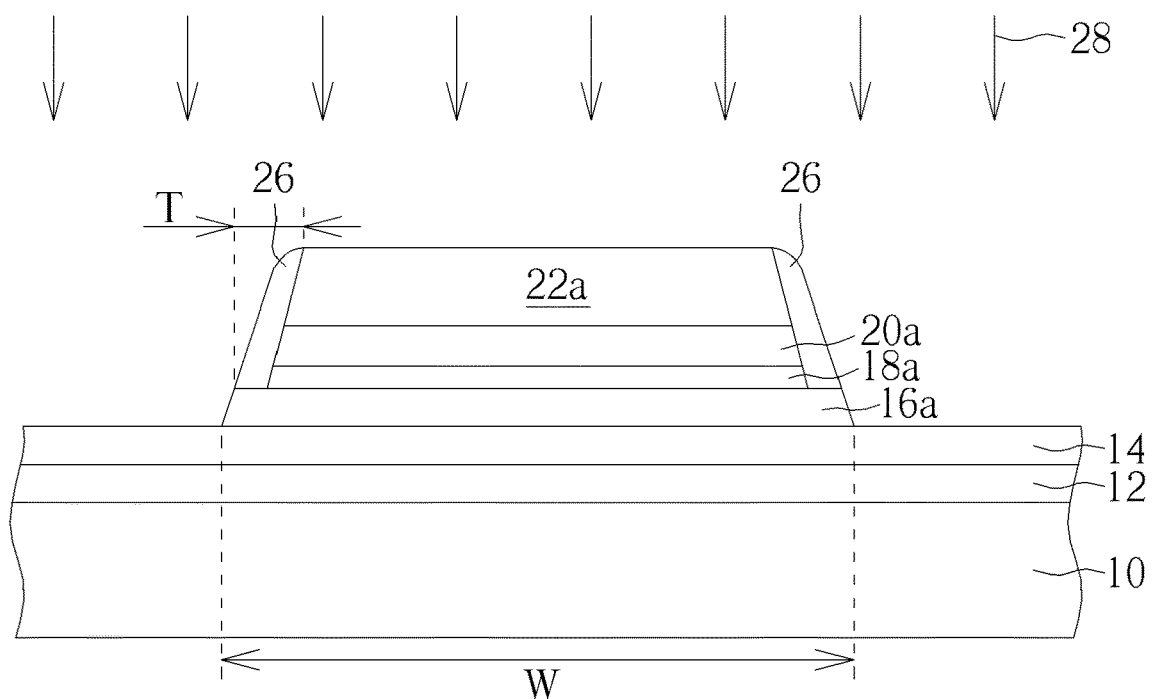

As shown in FIG. 3A and FIG. 4, another dry etching process 28 is performed. The dry etching process 28 includes etching the P-type group III-V compound material layer 16 by taking the spacer 26 and the patterned photoresist 22a as a second hard mask and taking the active layer 14 as an etching stop layer. The P-type group III-V compound material layer 16 which is etched becomes a P-type group III-V gate 16a. Because the spacer 26 serves as the second hard mask when defining the P-type group III-V gate 16a, the width W of the P-type group III-V gate 16a is influenced by the thickness T of the spacer 26. When the thickness T of the spacer 26 increases, the width W of the P-type group III-V gate 16a increases as well. The width W of the P-type group III-V gate 16a and the thickness T of the spacer 26 are respectively parallel to the top surface of the substrate 10. The width W of the P-type group III-V gate 16a have an influence on the threshold voltage of a high electron mobility transistor. The thickness T of the spacer 26 can adjust the width W of the P-type group III-V gate 16a. Therefore, the threshold voltage can be modulated by controlling the thickness T of the spacer 26.

Figure 5:
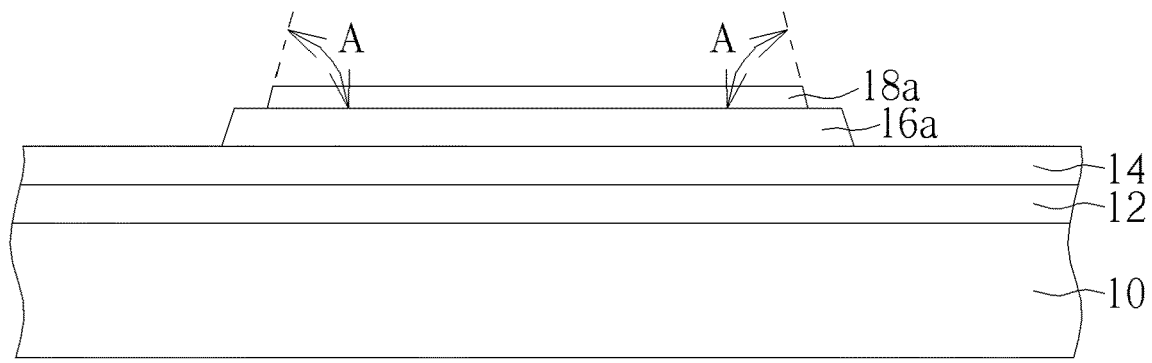

As shown in FIG. 5, the spacer 26, the patterned photoresist 22a and the hard mask 20a are removed. It is noteworthy that the metal compound layer 18a is formed by the dry etching process 24. As shown in FIG. 5, under a sectional view, an acute angle A is formed between a sidewall of the metal compound layer 18a and a top surface of the P-type group III-V gate 16a. In details, the metal compound layer 18a has two opposed sidewalls. Two acute angles A are respectively formed between one of the sidewalls and the top surface of the P-type group III-V gate 16a and between another sidewall and the top surface of the P-type group III-V gate 16a. Each of the acute angles A is between 30 and 80 degrees. The range of the acute angles A is a feature specially formed by the fabricating process of the present invention. If the metal compound layer 18a is formed by a wet etching process, the angle between the sidewall of the metal compound layer 18a and the top surface of the P-type group III-V gate 16a will be a right angle or will be larger than 80 degrees.

Figure 6:
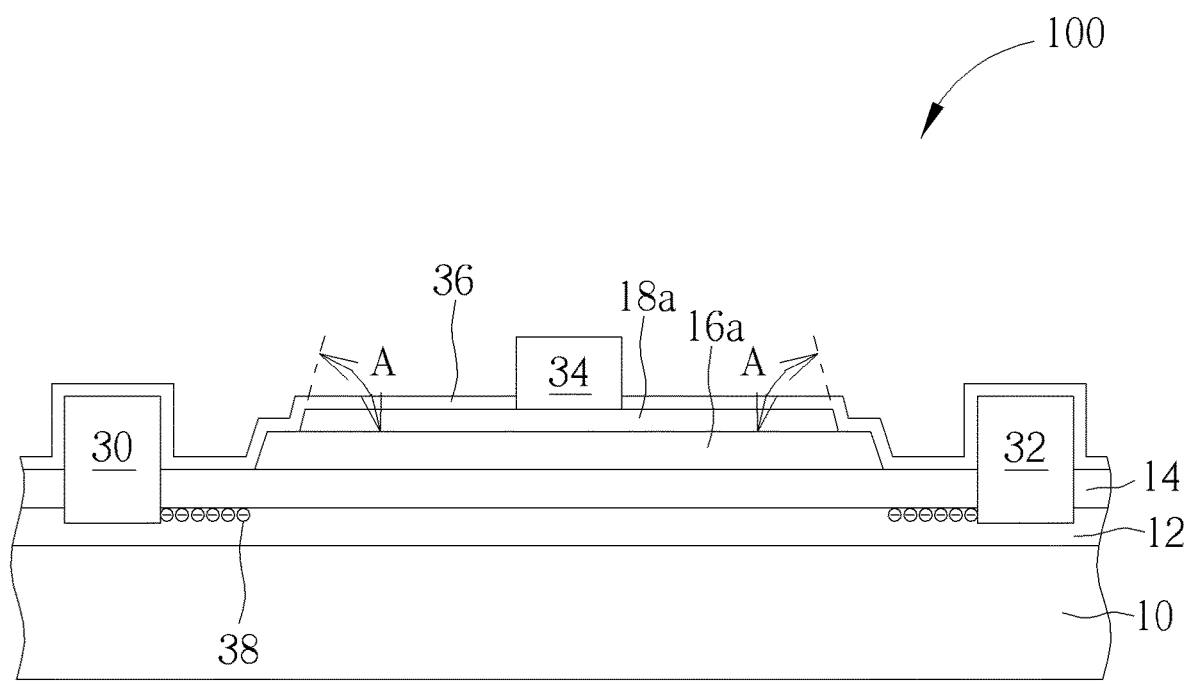

As shown in FIG. 6, a source electrode 30, a drain electrode 32 and a gate electrode 34 are formed on the substrate 10. In details, the source electrode 30 and the drain electrode 32 are formed to contact the channel layer 12. Then, a protective layer 36 is formed conformally to cover the source electrode 30, the drain electrode 32, the active layer 14, the P-type group III-V gate 16a and the metal compound layer 18a. Later, the protective layer 36 is etched to form an opening therein. Subsequently, the gate electrode 34 is formed to cover the opening and contact the metal compound layer 18a. Now, a high electron mobility transistor 100 of present invention is completed.

FIG. 6 depicts a high electron mobility transistor fabricated by a fabricating method provided in the present invention. The high electron mobility transistor 100 includes a substrate 10, a channel layer 12, an active layer 14, a P-type group III-V gate 16a and a metal compound layer 18a disposed on the substrate 10. The channel layer 12, the active layer 14, the P-type group III-V gate 16a and the metal compound layer 18a are disposed from bottom to top. The metal compound layer 18a contacts the P-type group III-V gate 16a. The metal compound layer 18a has two sidewalls which are opposed to each other, two acute angles A are respectively formed between one of the sidewalls and a top surface of the P-type group III-V gate 16a and between another sidewall and the top surface of the P-type group III-V gate 16a. The aforesaid sidewalls face toward the metal compound layer 18a itself. The metal compound layer 18a only covers part of the P-type group III-V gate 16a. A source electrode 30, a drain electrode 32 and a gate electrode 34 are disposed on the active layer 14.

P-type group III-V gate 16a includes P-type gallium nitride. The metal compound layer 18a includes titanium nitride or tantalum nitride. The channel layer 12 includes gallium nitride, indium gallium nitride, aluminum gallium nitride, aluminum indium nitride, aluminum indium gallium nitride or aluminum nitride. The active layer 14 includes aluminum gallium nitride, aluminum indium nitride, aluminum indium gallium nitride or aluminum nitride. The high electron mobility transistor is a normally-off transistor. Two dimensional electron gas 38 generates at the interface between the active layer 14 and the channel layer 12.

The present invention takes by-products (spacer) which is formed during dry etching the metal compound material layer and the hard mask material layer as a mask to etch the P-type group III-V compound material layer so as to form the P-type group III-V gate. Traditionally, the P-type group III-V gate is formed by taking a hard mask as a mask to dry etch the P-type group III-V compound material layer and the metal compound layer so as to form the P-type group III-V gate and the metal compound layer which are with the same width. Later, the P-type group III-V gate and the metal compound layer are moved to a wet etching chamber to perform a wet etching. During the wet etching, the width of the metal compound layer is decreased. Comparing to the traditional way, the method of the present invention does not need the wet etching. Furthermore, by using by-products as a mask, an extra mask is not needed. After etching the metal compound material layer, the P-type group III-V compound material layer is etched in the same chamber by adjusting several operational parameters. Therefore, the fabricating method of the present invention is simpler than the traditional method.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, comprising:
a substrate;
a channel layer, an active layer, a P-type group III-V gate and a metal compound layer disposed on the substrate, wherein the channel layer, the active layer, the P-type group III-V gate and the metal compound layer are disposed from bottom to top, the metal compound layer contacts the P-type group III-V gate, the metal compound layer has two sidewalls which are opposed to each other, two acute angles are respectively formed between one of the two sidewalls and a top surface of the P-type group III-V gate and between the other of the two sidewalls and the top surface of the P-type group III-V gate; and
a source electrode, a drain electrode and a gate electrode disposed on the active layer, wherein the gate electrode is separate from the metal compound layer.

2. The high electron mobility transistor of claim 1, wherein each of the two acute angles is between 30 and 80 digresses.

3. The high electron mobility transistor of claim 1, wherein the metal compound layer only covers part of the P-type group III-V gate.

4. The high electron mobility transistor of claim 1, wherein the metal compound layer comprises titanium nitride or tantalum nitride.

* * * * *